(12) United States Patent
Chang

(10) Patent No.: US 7,320,901 B2
(45) Date of Patent: Jan. 22, 2008

(54) FABRICATION METHOD FOR A CHIP PACKAGING STRUCTURE

(75) Inventor: Wen-Yin Chang, Taipei (TW)

(73) Assignee: Taiwan Solutions Systems Corp., Hsin-Chu (TW)

(*) Notice: Subject to any disclaimer, the term of this patent is extended or adjusted under 35 U.S.C. 154(b) by 263 days.

(21) Appl. No.: 11/261,462

(22) Filed: Oct. 31, 2005

(65) Prior Publication Data

US 2007/0099339 A1 May 3, 2007

(51) Int. Cl.
*H01L 21/50* (2006.01)
(52) U.S. Cl. ............................ 438/106; 257/E21.499
(58) Field of Classification Search ............... 438/106; 257/E21.499
See application file for complete search history.

(56) References Cited

U.S. PATENT DOCUMENTS

2005/0153483 A1* 7/2005 Groenhuis et al. .......... 438/124

* cited by examiner

*Primary Examiner*—Scott B. Geyer
*Assistant Examiner*—Elias Ullah
(74) *Attorney, Agent, or Firm*—Rosenberg, Klein & Lee

(57) ABSTRACT

A fabrication method for a chip packaging structure disclosed herein is utilizing the method of plating metal to connect different layers so as to replace the traditional method that drill hole firstly and then plate metal in the hole. In the present invention, the metal in the conductive through hole is solid metal so as can provide good ability of heat sinking. Besides, the present fabrication method utilizes the existing manufacturing processes without extra process or equipment so as can decrease the PCB processes and lower the package cost.

21 Claims, 7 Drawing Sheets

FABRICATION METHOD FOR A CHIP PACKAGING STRUCTURE

BACKGROUND OF THE INVENTION

1. Field of the Invention

The present invention generally relates to chip package technology, and more particularly relates to a fabrication method of a chip packaging structure with good heat dissipation.

2. Description of the Prior Art

Accordingly, the semiconductor technology is rapidly enhanced with the development the multi-function of the computer and the Internet communication product. Owing to the requirement of the diversification, portable, thin film and compact, the processes of the chip package industry is gradually developed to the trend of high power, high density, thin, film and compact. The electronics packaging not only provides the transmission of the electronics signal and the electric power, but the most important thing is the heating sinking and the protection of the package structure.

Owing to the heat source of the electronics packaging elements is mainly from the chip that provides with the characteristics of the high power, high density, small volume, so the heat capacity of the heat sinking is much higher than conventional packaging technology. Hence, the chip package with good heat dissipation becomes more important than before.

SUMMARY OF THE INVENTION

One of objects of the present invention is to provide a fabrication method for a chip packaging structure that utilizes the method of plating metal to electrically connect different layers so as to replace the traditional method that drills hole first and then plates metal in the hole.

Another of objects of the present invention is to provide a fabrication method for a chip packaging structure that utilizes the method of plating metal to electrically connect different layers. The metal in the conductive through hole is solid metal so as can provide the good ability of heat sinking.

Further one of objects of the present invention is to provide a fabrication method for a chip packaging structure that utilizes the present manufacturing processes of the package industry without extra process or equipment so as to decrease the PCB processes and lower the package cost.

Accordingly, one embodiment of the present invention provides a fabrication method for a chip packaging structure including: providing a carrier plate, wherein a conductive layer is formed on the upper surface of the carrier plate; forming a plurality of trenches penetrating through the conductive layer by utilizing the photolithography process; forming a first patterned photoresist layer on those trenches and a first photoresist layer on the downward surface of the carrier plate, wherein those trenches are filled by the first patterned photoresist layer; filling at least a metal layer on the conductive layer between the first patterned photoresist layer; performing a metal surface treatment on the surface of the metal layer, wherein the metal layer includes a plurality of conductive joints; removing the first patterned layer and the first photoresist layer; and proceeding a chip packaging process.

Other advantages of the present invention will become apparent from the following description taken in conjunction with the accompanying drawings wherein are set forth, by way of illustration and example, certain embodiments of the present invention.

BRIEF DESCRIPTION OF THE DRAWINGS

The foregoing aspects and many of the accompanying advantages of this invention will become more readily appreciated as the same becomes better understood by reference to the following detailed description, when taken in conjunction with the accompanying drawings, wherein.

DESCRIPTION OF THE PREFERRED EMBODIMENT

FIG. 1 to FIG. 11 are schematic representations of the cross-section view of the formulation steps of the fabrication method for a chip packaging structure illustrates one embodiment of the present invention.

Figure 1:
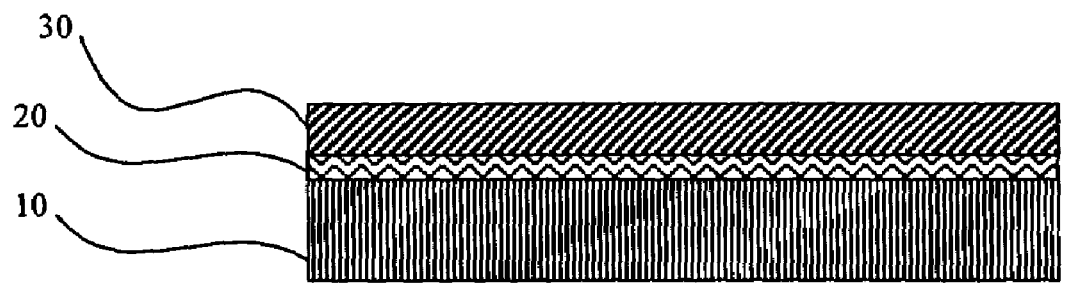
FIG. 1 to FIG. 11 are schematic representations of the cross-section view of the formulation steps of the fabrication method for a chip packaging structure in accordance with one embodiment of the present invention.

Referring to FIG. 1, first, a carrier plate 10 is made of metal, glass, ceramic, or polymer material. There are sequentially arranged an adhesive layer 20 and a conductive layer 30 on the upper surface of the carrier plate 10. The carrier plate 10, the adhesive layer 20 and the conductive layer 30 may be the commercial product. Besides, the adhesive layer 20 may be formed on the carrier plate 10 by the method of laminating, printing, spin coating, sputtering, electroless plating, or plating. Then, the conductive layer 30 may be formed on the adhesive layer 20 by the method of laminating, printing, spray coating, spin coating, evaporation, sputtering, electroless plating, or plating. The adhesive layer 20 is made of metal, glass, ceramic or polymer material. A surface roughing treatment process may be performed on the conductive layer 30, wherein the surface roughing treatment process includes the method of micro etching, sand blasting, polishing, blackening, or browning.

Figure 2:
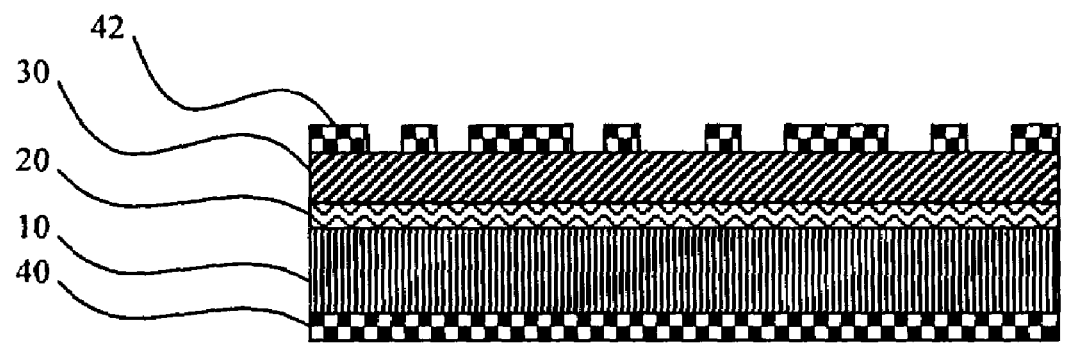
Figure 3:
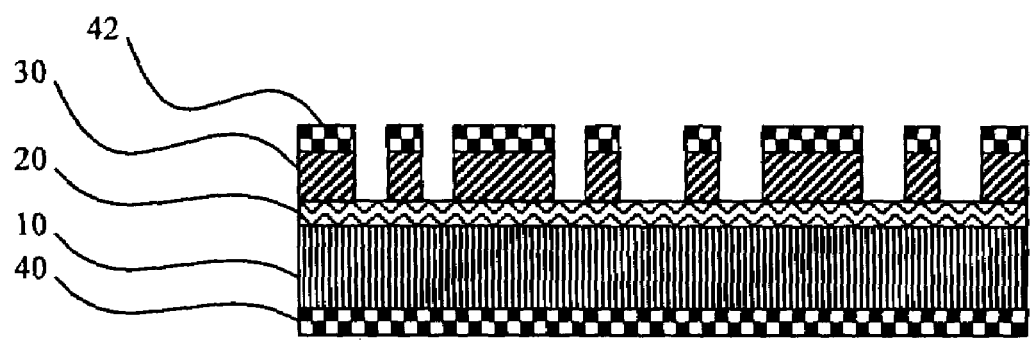
Figure 4:
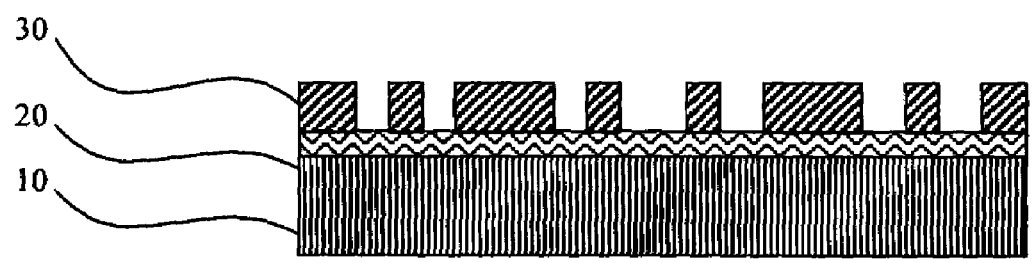

Following, a plurality of trenches penetrating through the conductive layer 30 are formed by utilizing the photolithography process, referring to FIG. 2, FIG. 3 and FIG. 4. By using the suitable method, such as coating or adhering, there are sequentially formed a patterned film 42 and a film 40 on the conductive layer 30 and on the downward surface of the carrier plate 10 by utilizing the image transferring. The patterned film 42 and the film 40 are used as the mask to etch to form trenches penetrating through the conductive layer 30. Then, the patterned film 42 and the film 40 are removed. Trenches may be also penetrating the adhesive layer 20 and the conductive layer 30.

Figure 5:
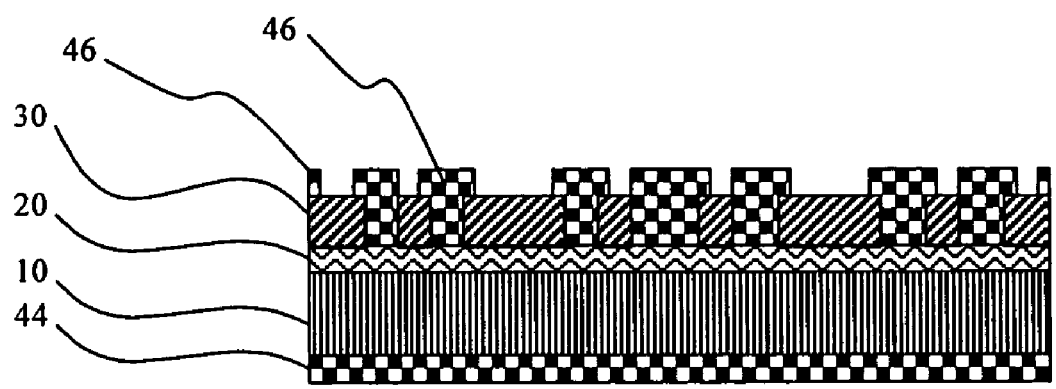
Figure 6:
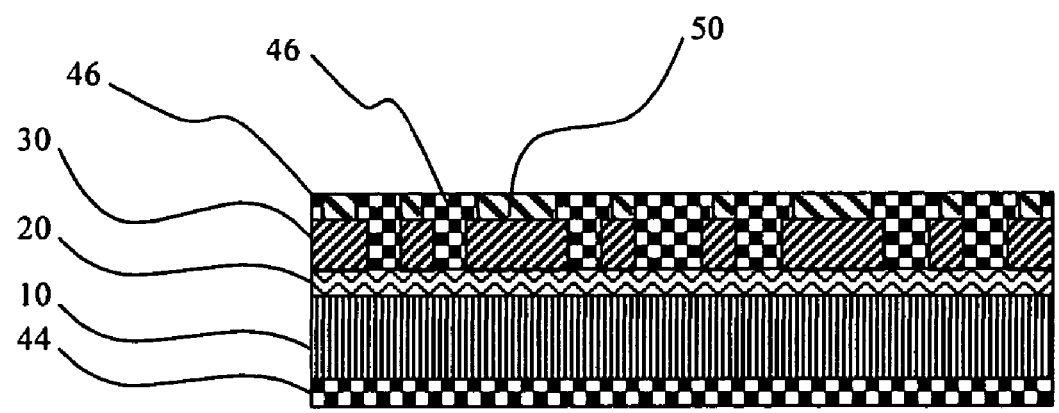

Next, referring to FIG. 5, a first patterned photoresist layer 46 and a first photoresist layer are respectively formed on the conductive layer 30 and on the downward surface of the carrier plate 10 by utilizing the photolithography process. The first patterned photoresist layer 46 is filled upto the trenches penetrating the conductive layer 30 or penetrating the conductive layer 30 and the adhesive layer 20. As shown in FIG. 6, a metal layer 50 is filled on the conductive layer 30 between the first patterned photoresist layer 46. The metal layer 50 is made of Cu, Pd, Ni or Ni/Pd/Au and formed by the method of sputtering, evaporation, electroless plating, or plating. The metal layer 50 is used for electrically connecting the upper layer and the downward layer. After, a surface roughing treatment processing may be performed on the surface of the metal layer 50, wherein the surface roughing treatment process includes the method of micro etching, sand blasting, polishing, blackening, or browning.

Figure 7:
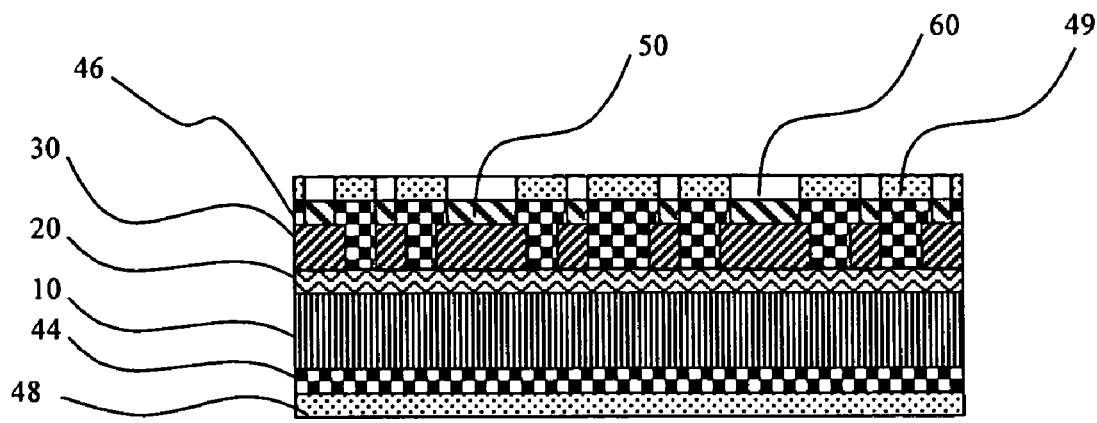
Figure 8:
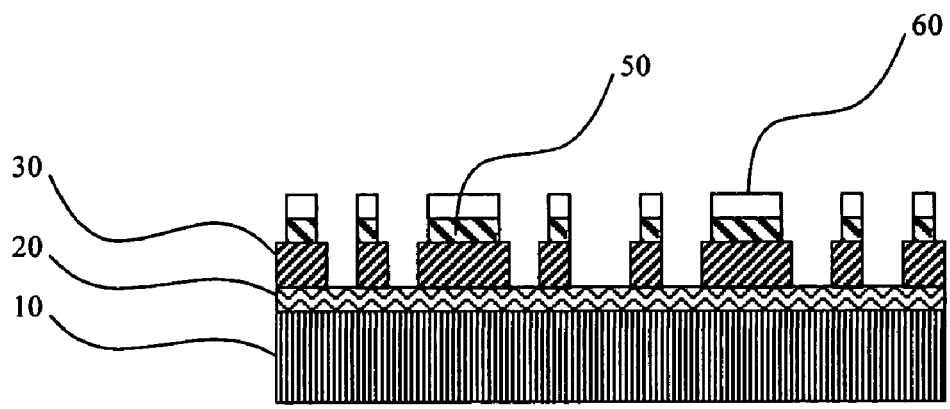

Following, referring to FIG. 7, a second patterned photoresist layer 49 and a second photoresist layer 48 are respectively formed on the first patterned photoresist layer 46 and the downward surface of the first photoresist layer 44. Next, a metal surface treatment is performed on the surface of the metal layer 50. The metal surface treatment is performed by the method of printing, evaporation, sputtering, electroless plating, or plating. A metal treatment layer 60 formed by the metal surface treatment is made of Ni, Au, Ag, or Cu. Next, such as shown in FIG. 8, the second patterned photoresist layer 49, the second photoresist layer 48, the first patterned photoresist layer 46 and the first photoresist layer 44 are removed. In one embodiment, the metal layer 50 is dividing into a chip carrier area and conductive joints. In another embodiment, the metal layer 50 is only used for the conductive joints. Such as not shown in the figure, before the metal surface treatment and after filling the metal layer 50, the first patterned photoresist layer 46 and the first photoresist layer 44 may be removed firstly. Then, the second patterned photoresist layer 49 and the second photoresist layer 48 are respectively formed on the trenches and the downward surface of the carrier plate 10. After the metal surface treatment, the second patterned photoresist layer 49 and the second photoresist layer 48 are removed.

Figure 9:
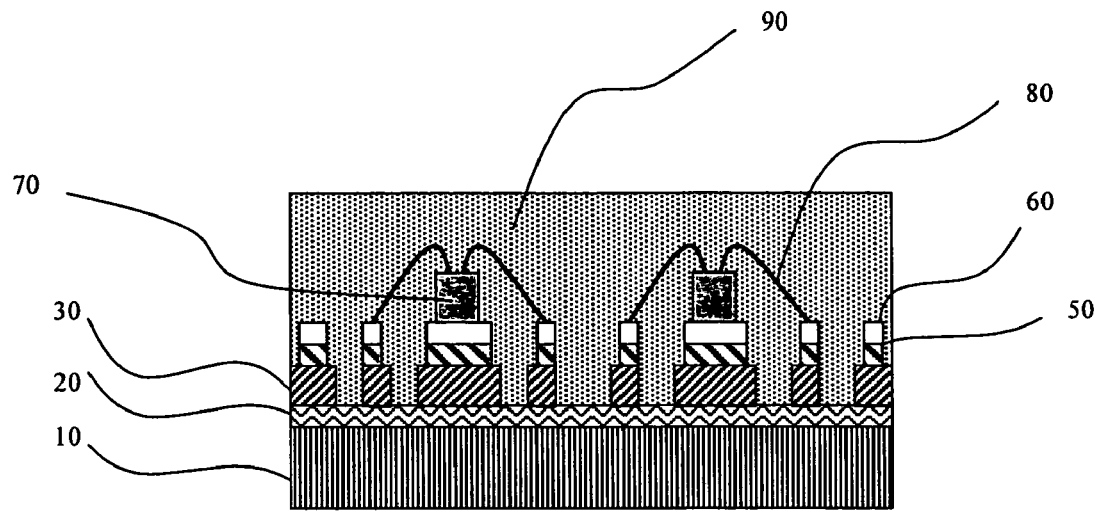
Figure 10:
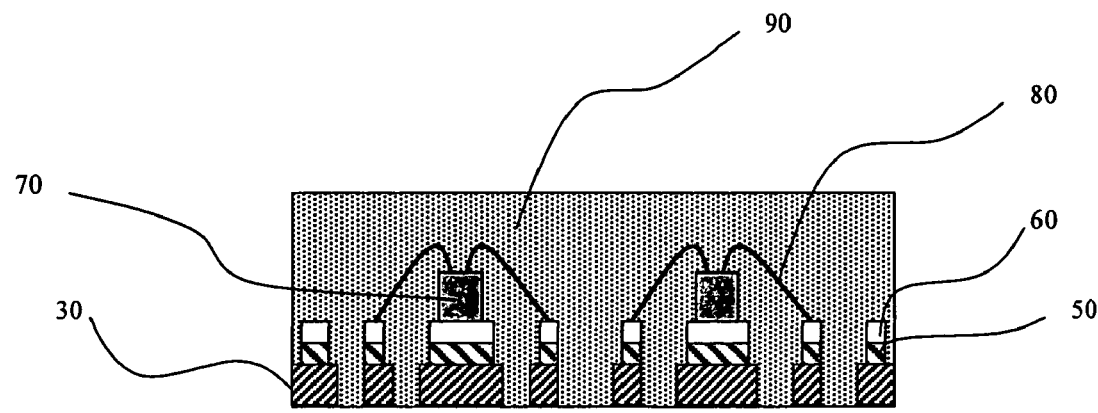
Figure 11:
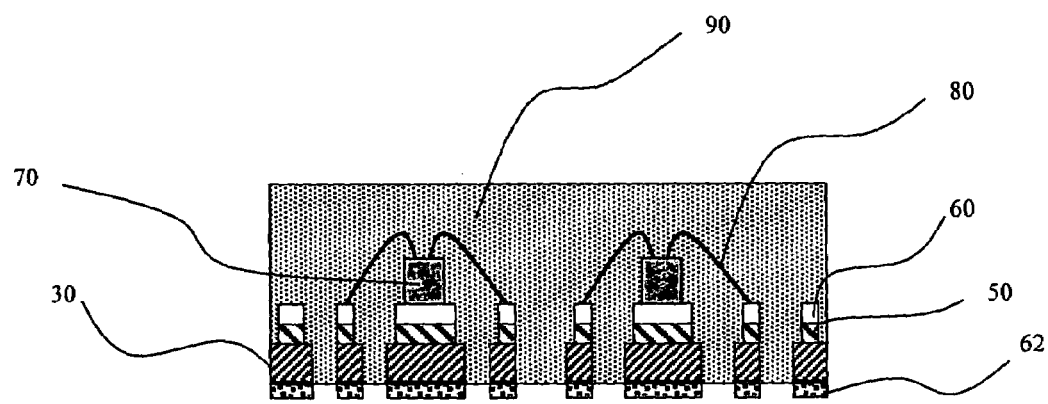

After, referring to FIG. 9, a chip packaging process is performed. A chip 70 is arranged on the chip carrier area and pluralities of leads 80 are used for electrically connecting the chip 70 and the conductive joints. Following, an encapsulant 90 is formed to cover the chip 70 and leads 80. Next, referring to FIG. 10 and FIG. 11, in the present embodiment, the carrier plate 10 and the adhesive layer 20 are removed and then a pad 62 is formed on the downward surface of the conductive layer 30 by utilizing the surface mount technology (SMT) method. The pad 62 is used for connecting with other electronics equipments. In one embodiment, it may only remove the carrier plate 10 and then form a pad on the downward surface of the adhesive layer 20 by utilizing the surface mount technology (SMT) method. In the present invention, the chip packaging process can utilize the wire bonding method or the flip chip bonding method.

Figure 12:
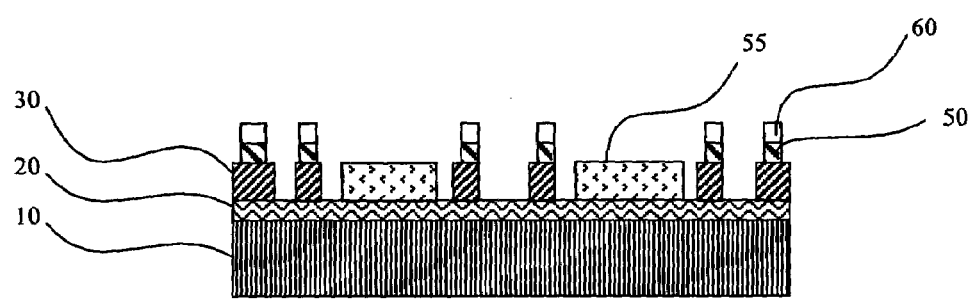
FIG. 12 and FIG. 13 are schematic representations of the cross-section view of the fabrication method for a chip packaging structure in accordance with another embodiment of the present invention.
Figure 13:
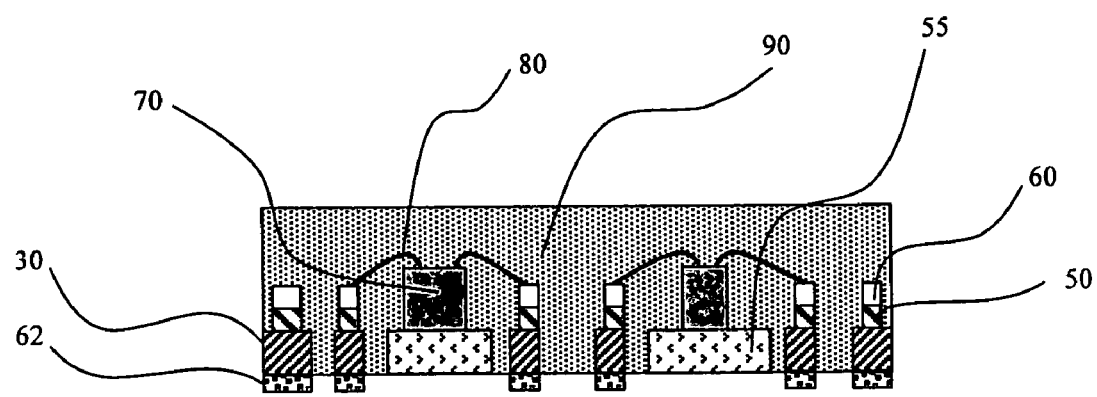

FIG. 12 and FIG. 13 are schematic representations of the cross-section view illustrate another embodiment of the present invention. Referring to FIG. 12, comparing the difference of the embodiment above mentioned, in the present embodiment, the metal layer 50 is merely used for electrically connecting. An isolation layer 55 is formed on the adhesive layer 20 at the designated chip carrier area by utilizing the appropriate method, such as coating, for carrying the chip 70. As shown in FIG. 13, it could be understood that the chip 70 is arranged on the isolation layer 55 and the bonding height of the chip 70 and leads 80 could be different so as to resolve the disadvantage of the common lead frame that could not heighten the chip 70. Besides, owing to the chip 70 is arranged on the isolation layer 55, the short problem is prevented so as can enhance the flexibility of the PCB layout.

To sum up the forgoing, the present invention is to provide a fabrication method for a chip packaging structure that utilizes the plating metal way to connect different layers so as to replace the traditional way to drill hole and then plate metal in the hole. The metal in the conductive through hole is solid metal so as can provide good ability of heat sinking. The present invention utilizes the existing manufacturing processes of the package industry without extra process or equipment so as can decrease the PCB processes and lower the package cost.

While the present invention is susceptible to various modifications and alternative forms, a specific example thereof has been shown in the drawings and is herein described in detail. It should be understood, however, that the invention is not to be limited to the particular form disclosed, but to the contrary, the invention is to cover all modifications, equivalents, and alternatives falling within the spirit and scope of the appended claims.

What is claimed is:

1. A fabrication method for a chip packaging structure comprising:
   providing a carrier plate, wherein a conductive layer is formed on an upper surface of said carrier plate;
   forming a plurality of trenches penetrating through said conductive layer by utilizing the photolithography process;
   forming a first patterned photoresist layer on said upper surface and a first photoresist layer on a downward surface of said carrier plate, wherein said trenches are filled by said first patterned photoresist layer;
   filling at least a metal layer on said conductive layer between said first patterned photoresist layer, wherein said metal layer includes a plurality of conductive joints;
   performing a metal surface treatment on the surface of said metal layer;
   removing said first patterned layer and said first photoresist layer; and
   proceeding a chip packaging process.

2. The fabrication method for a chip packaging structure according to claim 1, further comprising providing an adhesive layer between said carrier plate and said conductive layer.

3. The fabrication method for a chip packaging structure according to claim 2, wherein said adhesive player is made of metal, conductive material, or polymer material.

4. The fabrication method for a chip packaging structure according to claim 2, wherein said adhesive layer is formed by the method of adhering, laminating, printing, spray coating, spin coating, evaporation, sputtering, electroless plating, or plating.

5. The fabrication method for a chip packaging structure according to claim 1, wherein said carrier plate is made of metal, glass, ceramic, or polymer material.

6. The fabrication method for a chip packaging structure according to claim 1, wherein said metal layer is made of Cu, Pd, Ni or Ni/Pd/Au.

7. The fabrication method for a chip packaging structure according to claim 1, wherein said metal layer is formed by the method of sputtering, evaporation, electroless plating, or plating.

8. The fabrication method for a chip packaging structure according to claim 1, wherein said conductive layer is formed by the method of adhering, laminating, printing, spray coating, spin coating, evaporation, sputtering, electroless plating, or plating.

9. The fabrication method for a chip packaging structure according to claim 1, further comprising a step of forming a second patterned photoresist layer on said first patterned photoresist layer and a second photoresist layer on the downward surface of said first photoresist layer.

10. The fabrication method for a chip packaging structure according to claim 9, wherein said second patterned photoresist layer and said second photoresist layer are formed by utilizing the photolithography process.

11. The fabrication method for a chip packaging structure according to claim 1, wherein said first patterned photoresist layer and said first photoresist layer are formed by utilizing the photolithography process.

12. The fabrication method for a chip packaging structure according to claim 1, wherein said metal surface treatment is utilizing the method of printing, evaporation, sputtering, electroless plating, or plating.

13. The fabrication method for a chip packaging structure according to claim 12, wherein a metal treatment layer formed by said metal surface treatment is made of Ni/Au, Ag, or Cu.

14. The fabrication method for a chip packaging structure according to claim 1, further comprising a surface roughing treatment process on said metal layer and said conductive layer.

15. The fabrication method for a chip packaging structure according to claim 14, wherein said surface roughing treatment process comprises the method of micro etching, sand blasting, polishing, blackening, or browning.

16. The fabrication method for a chip packaging structure according to claim 1, before performing metal surface treatment and after removing said patterned photoresist layer and said first photoresist layer, further comprising a step of forming a second patterned photoresist layer on said trench and a second photoresist layer on said downward surface of said carrier plate.

17. The fabrication method for a chip packaging structure according to claim 16, further comprising a step of removing said second patterned photoresist layer and said second photoresist layer before said chip packaging process.

18. The fabrication method for a chip packaging structure according to claim 1, wherein said chip packaging process comprising the following steps:
    arranging at least one chip on a chip carrier area of said metal layer;
    electrically connecting said conductive joints to said chip with a plurality of leads; and
    forming a package encapsulant to cover said chip and said leads.

19. The fabrication method for a chip packaging structure according to claim 1, further comprising a step of forming an isolation layer between said conductive joints after said metal surface treatment.

20. The fabrication method for a chip packaging structure according to claim 19, wherein said chip packaging process comprising the following steps:
    arranging at least one chip on a chip carrier area of said isolation layer;
    electrically connecting said conductive joints to said chip with a plurality of leads; and
    forming a package encapsulant to cover said chip and said leads.

21. The fabrication method for a chip packaging structure according to claim 1, wherein said chip packaging process is utilizing the wire bonding method or the flip chip bonding method.

* * * * *